(12) United States Patent
Kuehn

(10) Patent No.: US 6,300,808 B1
(45) Date of Patent: Oct. 9, 2001

(54) ARRANGEMENT FOR OFFSET CURRENT COMPENSATION OF PHASE DETECTOR

(75) Inventor: Hans-Jürgen Kuehn, Buchholz (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/592,062

(22) Filed: Jun. 12, 2000

(30) Foreign Application Priority Data

Jun. 11, 1999 (DE) .............................................. 199 26 666

(51) Int. Cl.$^7$ ....................................................... H03L 7/06
(52) U.S. Cl. ............................................. 327/159; 327/156
(58) Field of Search ..................................... 327/156, 157, 327/159; 375/376; 331/DIG. 2

(56) References Cited

U.S. PATENT DOCUMENTS 6,114,888 * 9/2000 Walley ................................... 327/157
6,141,394 * 10/2000 Linebarger et al. ................... 375/376

* cited by examiner

*Primary Examiner*—Kenneth B. Wells
*Assistant Examiner*—Linh Nguyen
(74) *Attorney, Agent, or Firm*—Steven R. Biren

(57) ABSTRACT

In an arrangement for offset current compensation of a phase detector (4) which is provided in a phase-locked loop (2) to which an acquisition circuit (7) is assigned which, in a switch-on phase of the phase-locked loop (2), supplies acquisition pulses to a loop filter (5) arranged in the phase-locked loop (2) before applying an input signal to the phase-locked loop (2) so as to bring the operating frequency of a controllable oscillator (6) in the phase-locked loop within a predetermined frequency window, the arrangement (1) determines an offset correction current during at least one time interval of the switch-on phase when acquisition pulses occur, which offset correction current serves for compensating the offset current of the phase detector (4), the value and the sign of the offset correction current being selected in dependence upon the rate and sign of the acquisition pulses in such a way that no acquisition pulses occur any longer at the end of the switch-on phase, and in that the arrangement (1) superimposes the offset correction current thus determined on the output signal of the phase comparator (4) also during operation of the phase-locked loop outside the switch-on phase.

11 Claims, 2 Drawing Sheets

ARRANGEMENT FOR OFFSET CURRENT COMPENSATION OF PHASE DETECTOR

BACKGROUND OF THE INVENTION

The invention relates to an arrangement for offset current compensation of a phase detector which is provided in a phase-locked loop to which an acquisition circuit is assigned which, in a switch-on phase of the phase-locked loop, supplies acquisition pulses to a loop filter arranged in the phase-locked loop before applying an input signal to the phase-locked loop so as to bring the operating frequency of a controllable oscillator in the phase-locked loop within a predetermined frequency window.

A phase-locked loop to which an acquisition circuit is assigned is known from PCT application 98-5355482 (PHN 16366). The acquisition circuit is used to bring the operating frequency of the controllable oscillator of this phase-locked loop within a frequency window after the current supply has been switched on and/or after a reset of the phase-locked loop, so as to enable the phase-locked loop to lock in on its frequency when an input signal is applied to the phase-locked loop. Particularly in the case of a narrow band construction of the phase-locked loop, this is necessary because the phase-locked loop will otherwise be unable to lock in the frequency of the input signal. This acquisition circuit thus supplies the kind of lock-in. This is realized by acquisition pulses which are fed to the loop filter and control the frequency of the controllable oscillator until its frequency is within the frequency window.

This arrangement is suitable as a lock-in in that it simplifies lock-in of the phase-locked loop on an input signal, but it is not capable of compensating offset currents of the phase detector. When the phase detector of the phase-locked loop is beset with offset currents, lock-in of the phase-locked loop on the frequency of the input signal can as yet be ensured by the acquisition circuit, but the phase-locked loop does not operate properly because it must constantly compensate the offset current of its phase detector. This in turn means that the two input signals of the phase detector are not in the desired phase position with respect to each other but in a deviating phase position which is caused by the fact that the offset current of the phase detector must be quasi compensated.

SUMMARY OF THE INVENTION

It is an object of the invention to provide an arrangement for compensating the offset current of the phase detector in such a phase-locked loop, to which an acquisition circuit is assigned.

According to the invention, this object is solved in that the arrangement (1) determines an offset correction current during at least one time interval of the switch-on phase when acquisition pulses occur, which offset correction current serves for compensating the offset current of the phase detector, the value and the sign of the offset correction current being selected in dependence upon the rate and sign of the acquisition pulses in such a way that no acquisition pulses occur any longer or occur very rarely at the end of the switch-on phase, and in that the arrangement superimposes the offset correction current thus determined on the output signal of the phase comparator also during operation of the phase-locked loop outside the switch-on phase.

The arrangement for offset current compensation according to the invention utilizes the acquisition circuit and the acquisition pulses supplied by this circuit for compensating the offset current of the phase comparator. In fact, when acquisition pulses also occur when the operating frequency of the controllable oscillator is at least temporarily within the predetermined frequency window, then this indicates that the operating frequency of the controllable oscillator is influenced by an offset current. Consequently, the arrangement supplies an offset correction current during at least a time interval of the switch-on phase, particularly an interval towards the end of the switch-on phase, when acquisition pulses occur. This offset correction current serves for compensating the offset current of the phase detector of the phase-locked loop and can be fed either directly to the phase-locked loop or to the phase detector itself. Dependent on how many acquisition pulses occur and which signs they have, the offset correction current is determined in such a way that possibly no acquisition pulses occur any longer at the end of the switch-on phase. This means that the operating frequency of the controllable oscillator is stable, which is a result of the offset current compensation because then the phase detector no longer supplies any offset current which would result in a drift of the operating frequency of the controllable oscillator.

The offset correction current is determined at least during a time interval of the switch-on phase. In the simplest case, the determination of the value of the offset correction current and its sign may be effected during the entire switch-on phase. At the start of the switch-on phase, a false offset correction current would then be determined, because in this phase the frequency of the controllable oscillator was not yet brought within the frequency window anyway by the acquisition circuit. Towards the end of the switch-on phase, whose length is chosen to be such that the acquisition circuit is capable in any case of bringing the frequency of the controllable oscillator within the frequency window, the frequency window should, however, be reached and the determination of the offset correction current would lead to the correct determination of the offset correction current in this final phase of the switch-on phase. It is also possible and even advantageous to determine the offset correction current during a time interval of the switch-on phase which lies at the end of the switch-on phase, because it is then most likely that the occurrence of the acquisition pulses is exclusively caused by offset correction currents.

The above-described mode of operation of the arrangement and the determination of the offset correction currents takes place during the switch-on phase in which no input signal is applied to the phase-locked loop. When the offset correction current has been determined by the arrangement according to the invention and when the switch-on phase has been terminated, the input signal on which the phase-locked loop should lock in is applied to the phase-locked loop. It is essential that the determined offset correction current also remains switched on after the end of the switch-on phase because it should now serve for correction of the offset current of the phase detector of the phase-locked loop in its normal mode of operation, where it unfolds its proper activity. In contrast to the acquisition pulses, which are no longer switched during normal operation of the phase-locked loop, the offset correction current remains switched on.

This results in an optimal mode of operation of the phase-locked loop because it no longer operates asymmetrically, even when the phase detector supplies an offset current, because the offset current is compensated by the offset correction current of the arrangement according to the invention. Independent of the existence and the value of an offset current, an optimal mode of operation of the phase-locked loop is thus always guaranteed. This is particularly important because such phase-locked loops are generally integrated and the tolerances of the circuit elements in such an integrated circuit are relatively large so that, due to asymmetries and other effects, an integrated phase detector often supplies offset currents which are not infrequently also so large that the entire circuit becomes unusable. Due to the arrangement according to the invention, such circuits, which would be unusable, can optimally operate because of the offset current compensation and do not have to be considered as rejects.

In an embodiment of the invention as defined in claim 2, the value and sign of the offset correction current is determined in steps. The arrangement operates in so-called correction cycli, with the occurrence of an acquisition pulse and possibly its sign being observed in each cycle. When such an acquisition pulse occurs in a cycle, a correction sub-current is added to the offset correction current independent of the sign of the acquisition pulse which is chosen in such a way that it is suitable to reduce the drift of the frequency of the controllable oscillator, i.e. the offset current of the phase detector.

This process is repeated in each correction cycle, so that in each correction cycle the value of the offset correction current increasingly better approximates the ideal value by virtue of the added correction sub-currents. This step-wise adaptation of the offset correction current, performed in correction cycli, to the actually available offset current may advantageously be performed in accordance with the further embodiment of the invention defined in claim 3. The register provided for this purpose switches the correction sub-currents and simultaneously serves the purpose of storing the correction sub-currents that have been determined. This is essential because the correction sub-currents and hence the offset current remain constantly switched on during normal operation.

In accordance with a further embodiment of the invention as defined in claim 4, current sources having the same value may be advantageously provided. These current sources have a half positive and a half negative sign but have the same value. These n correction sub-currents are switchable by means of the register. This embodiment allows, for example, the realization of current sources by means of a single current mirror comprising a plurality of output transistors.

In the correction cycli mode of operation of the arrangement according to the invention, in which cycli the optimal value of the offset correction current is determined, a further embodiment of the invention as defined in claim 5 advantageously adapts this value to the operating cycli of the acquisition circuit because then only one acquisition pulse, which is to be evaluated, possibly occurs in each correction cycle.

A further embodiment of the invention as defined in claim 8 provides the advantage that the value of the offset correction current is not determined until after the operating frequency of the controllable oscillator is within the frequency window or at least in its proximity. It may then be assumed that a further drift of the frequency of the controllable oscillator is caused by an offset current.

In accordance with further embodiments of the invention as defined in claims 9 and 10, the offset correction current may either be fed to the output signal of the phase comparator and hence to the input signal of the loop filter or may be used within the phase detector for the purpose of reducing the offset current. This may be effected, for example, by superimposing currents on the offset correction current, which currents are supplied by current sources for a differential amplifier in the phase detector. In this case, the cause of the offset current would be directly corrected.

These and other aspects of the invention are apparent from and will be elucidated with reference to the embodiments described hereinafter.

DESCRIPTION OF THE PREFERRED EMBODIMENTS

Figure 1:
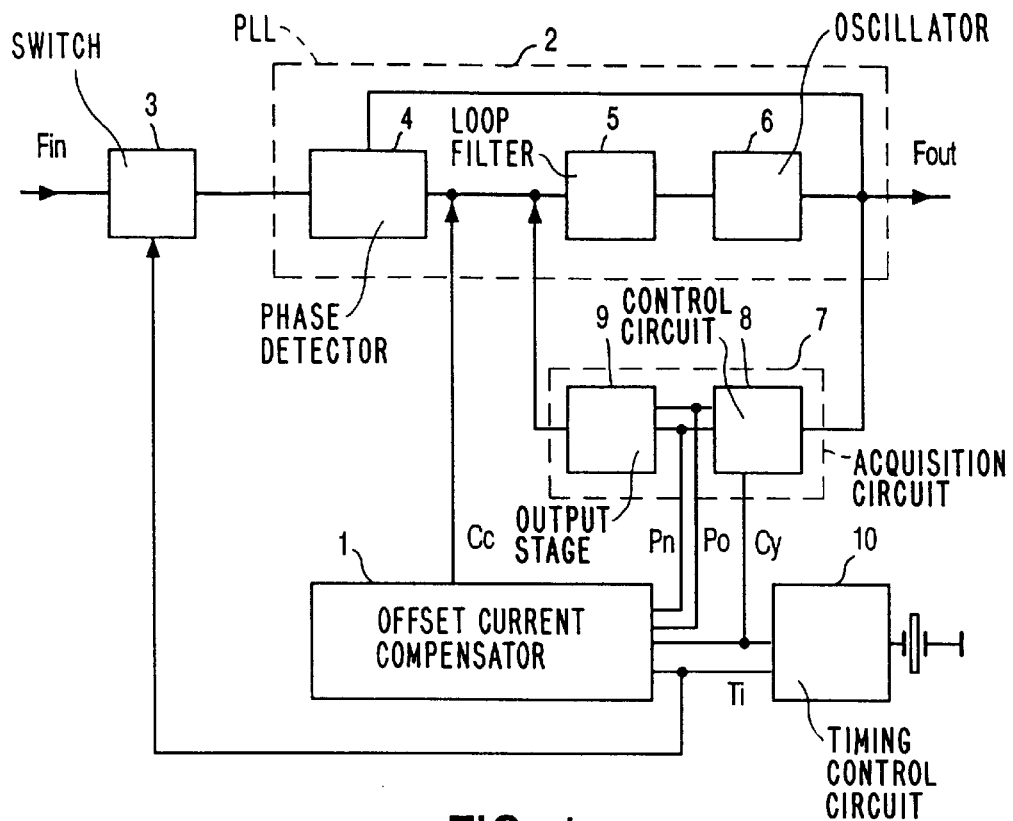
FIG. 1 is a block diagram of a phase-locked loop with an associated acquisition circuit and with an arrangement for offset current compensation according to the invention.

The block diagram of FIG. 1 shows an arrangement 1 for offset current compensation according to the invention, to which a phase-locked loop 2 is assigned.

The phase-locked loop 2 is preceded by a switch 3 whose input can receive an input signal Fin. By means of the switch 3, this can be applied to a phase detector 4 in the phase-locked loop 4. The phase detector 4 precedes a loop filter 5 and a controllable oscillator 6 whose output signal represents the output signal of the phase-locked loop which is denoted by Fout in the Figure. This output signal of the controllable oscillator 6 is applied to a second input of the phase detector 4.

To avoid individual filters preceding the phase-locked loop 2, such phase-locked loops are generally formed in a narrow band so that they have their own selectivity. However, the problem then occurs that such a phase-locked loop locks in within a very narrow frequency range, i.e. the frequency of the input signals Fin leads to this frequency only within a very narrow frequency range of lock-in of the phase-locked loop.

It is therefore advantageous to assign an acquisition circuit 7 to the phase-locked loop 2, which acquisition circuit is known from the state of the art and serves for bringing the operating frequency of the controllable oscillator 6 of the phase-locked loop 2 within a frequency window when an input signal Fin has not been applied. When the operating frequency of the controllable oscillator 6 is within this frequency window and when the input signal is then applied, the phase-locked loop can lock in faultlessly on the frequency of the input signal Fin.

To achieve this, a control circuit 8 is provided within the acquisition circuit 7, which control circuit determines the operating frequency of the controllable oscillator 6 of the phase-locked loop 2 and, dependent on its instantaneous operating frequency, applies control signals to an output stage 9 of the acquisition circuit 7 which supplies acquisition pulses for the signal fed to the loop filter 5. The rate and signs of the acquisition pulses are chosen to be such that the operating frequency of the controllable oscillator 6 is changed by the acquisition pulses towards the predetermined frequency window. When, for example, the operating frequency of the controllable oscillator is clearly below the predetermined frequency window after switching on in the switch-on phase, in which the input signal Fin has not yet been applied to the phase-locked loop 2, then the acquisition circuit 7 will feed such acquisition pulses to the loop filter 5 that these lead to an increase of the operating frequency of the controllable oscillator 6. Advantageously, the acquisition circuit 7 operates in cycli, while in each cycle the frequency of the controllable oscillator is measured again and, if necessary, a new acquisition pulse is generated and supplied. This process is repeated until the operating frequency of the controllable oscillator 6 has come within the predetermined frequency window.

In an optimal mode of operation of the phase-locked loop and particularly its phase detector 4, the operating frequency of the controllable oscillator 6 should then be constantly within the predetermined window so that also the supply of further acquisition pulses is no longer required. Actually, however, many phase detectors supply offset currents which still cause a further drift of the operating frequency of the controllable oscillator 6, even when the operating frequency of the controllable oscillator has been brought within the frequency window by means of the acquisition pulses, while the sign of the drift is dependent on the sign of the offset current. In other words, the operating frequency of the controllable oscillator 6 is not constant when offset currents occur and should again and again be brought back within the frequency window by means of the acquisition pulses.

By repeated correction of the frequency of the controllable oscillator 6 by means of the acquisition pulses, a lock-in of the phase-locked loop 2 on the frequency of the input signal Fin after its supply to the phase-locked loop can be achieved in this way. However, when the phase detector 4 supplies an offset current, the phase-locked loop operates asymmetrically. Here, asymmetric means that the phase relations of the two input signals of the phase detector 4 are not as desired, i.e. for example, are not exactly 90°. Due to the offset current supplied by the phase detector 4, the input signals have a deviating phase position with respect to each other, which is required to compensate the offset current of the phase detector. Since the phase position of the two signals is essential for many applications, this effect should be avoided.

To this end, the invention provides the arrangement 1 for offset current compensation. It supplies an offset correction current Cc which is either fed into the signal path between the output of the phase detector and the input of the loop filter 5 or is directly applied to the phase detector 4 where it is superimposed on, for example, currents which are supplied by current sources feeding the differential amplifier of the phase detector.

The determination of the value of this offset correction current Cc must in any case be carried out in the switch-on phase because in this switch-on phase the input signal Fin has not yet been applied to the phase-locked loop 2 which still operates freely.

As described above, the operating frequency of the controllable oscillator 6 is corrected by means of acquisition pulses in the switch-on phase by means of the acquisition circuit 7. The arrangement 1 according to the invention utilizes these acquisition pulses or control signals released by the acquisition pulses in that it evaluates these signals on their occurrence and their sign from which it determines the optimal value of the offset correction current Cc.

The time interval in which the arrangement according to the invention operates must in any case be within the switch-on phase. In extreme cases, it may be the entire switch-on phase but advantageously a time interval at the end of the switch-on phase is chosen.

The time interval in which the arrangement 1 for offset current compensation according to the invention operates is predetermined by means of a timing control circuit 10 which supplies a signal Ti indicating this time interval. This signal is applied to the arrangement 1.

The timing control circuit 10 further supplies a cycle signal Cy which is used both in the acquisition circuit 7 and in the arrangement 1 according to the invention for determining the operating cycli. This is advantageous because the operating cycli of the arrangement 1 according to the invention are adapted in this way to the operating cycli of the acquisition circuit 7 so that maximally one acquisition pulse can occur per operating cycle of the arrangement 1 according to the invention.

In the embodiment shown in FIG. 1, the arrangement 1 according to the invention does not directly evaluate the acquisition pulses of the acquisition circuit 7 but evaluates control signals Pn and Po which are supplied by the control circuit 8 of the acquisition circuit 7. The evaluation of the control signals is simpler than the direct evaluation of the acquisition pulses, but the latter operation is also possible.

A pulse occurs in the control signal Pn when the output stage 9 of the acquisition circuit 7 supplies an acquisition pulse. The control signal Po, however, supplies information about the sign of the acquisition pulse.

The arrangement 1 for offset current compensation according to the invention evaluates these signals. Advantageously, it can be determined in each operating cycle whether the acquisition circuit 7 generates an acquisition pulse and, if so, which sign it has. The arrangement 1 can deduce from this information in which direction a correction of the operating frequency of the controllable oscillator 6 is performed.

Particularly towards the end of the switch-on phase, the operating frequency of the controllable oscillator 6 should be constantly within the frequency window, as elucidated above. However, when acquisition pulses still occur, this is a sign that the phase comparator 4 of the phase-locked loop 2 supplies an offset current which causes a drift of the operating frequency of the controllable oscillator 6.

It is exactly this offset current that is to be compensated by the arrangement 1 according to the invention. In the above-described operating cycli, the value of the offset correction current Cc is therefore varied in dependence upon the occurring acquisition pulses and their signs are varied until the acquisition pulses no longer occur. Then, this means that the operating frequency of the controllable oscillator is constant, is within the frequency window and does not need to be corrected anymore. An optimal correction of the offset current of the phase detector 4 is then achieved.

After the end of the switch-on phase and after this offset current has been compensated in the optimal way, the timing control circuit 10 closes the switch 3 so that now the input signal Fin is applied to the phase-locked loop 2. Since the operating frequency of its controllable oscillator 6 is within the frequency window, this phase-locked loop can also lock in on the frequency of the input signal Fin when the phase-locked loop 2 has a narrow-band construction.

This ensures not only a safe lock-in of the phase-locked loop 2, but also an optimal mode of operation of the phase-locked loop by virtue of the arrangement 1 according to the invention, because an offset correction current possibly supplied by the phase detector 4 is corrected and thus the two input signals of the phase detector 4 have the desired mutual phase position. It should be particularly noted that the entire arrangement is advantageously integrated in a circuit in which, however, relatively large spreads of the circuit elements are possible. The offset current of the phase detector 4 may thus reach considerable values which have a disturbing effect. It may also be so large that the circuit as a whole is no longer usable. In all these cases, an optimal mode of operation can nevertheless be achieved with the arrangement 1 according to the invention.

Figure 2:
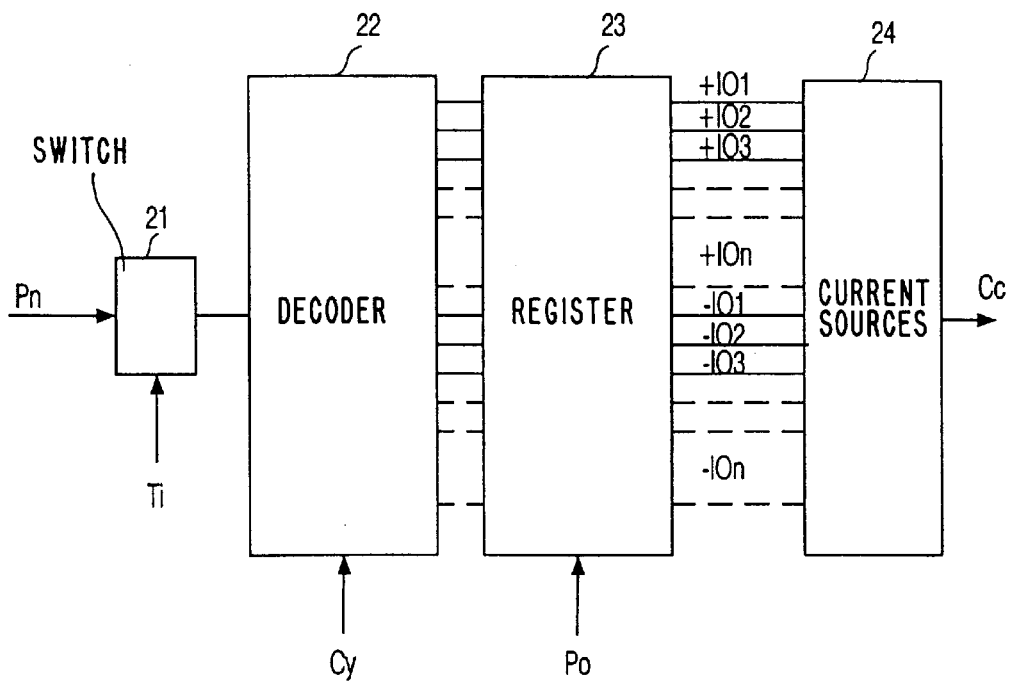
FIG. 2 is a block diagram of the arrangement for offset current compensation as shown in FIG. 1.

FIG. 2 is a block diagram of the arrangement 1 for offset current compensation according to the invention, as shown in FIG. 1.

A switch 21 is arranged at the input of the circuit, which switch is controlled by the signal Ti indicating the operating phase of the arrangement according to the invention, and switches the control signal Pn applied to the switch and controlling the acquisition pulses. The control signal Pn is thus applied to a decoder 22 during the operating phase of the arrangement according to the invention. The decoder 22 further receives the cycle signal Cy which predetermines the correction cycli. The decoder 22 determines whether an acquisition pulse occurs in the control signal Pn in an operating cycle. When such a pulse occurs, the decoder 22 supplies a corresponding control signal to a register 23. This control signal leads to the additional supply of a further correction sub-current to the offset correction current. The sign of the added correction sub-current is controlled by the signal Po which is applied to the register 23.

The offset correction current Cc supplied from the output of the arrangement is thus increased or decreased by a correction sub-current in each correction cycle. The output of the register 23 supplies corresponding control signals +IO1 to +IOn and −IO1 to −IOn to succeeding current sources 24.

In FIG. 2, the current sources 24 are shown in a block which comprises, for example, a current mirror with a plurality of output transistors conform the number of desired correction sub-currents.

At every correction cycle, a new correction sub-current is added when an acquisition pulse occurs. The sign of the added correction sub-current is dependent on the acquisition pulse and is selected in such a way that the added correction sub-current counteracts the drift of the operating frequency of the controllable oscillator 6 of the circuit shown in FIG. 1.

Figure 3:
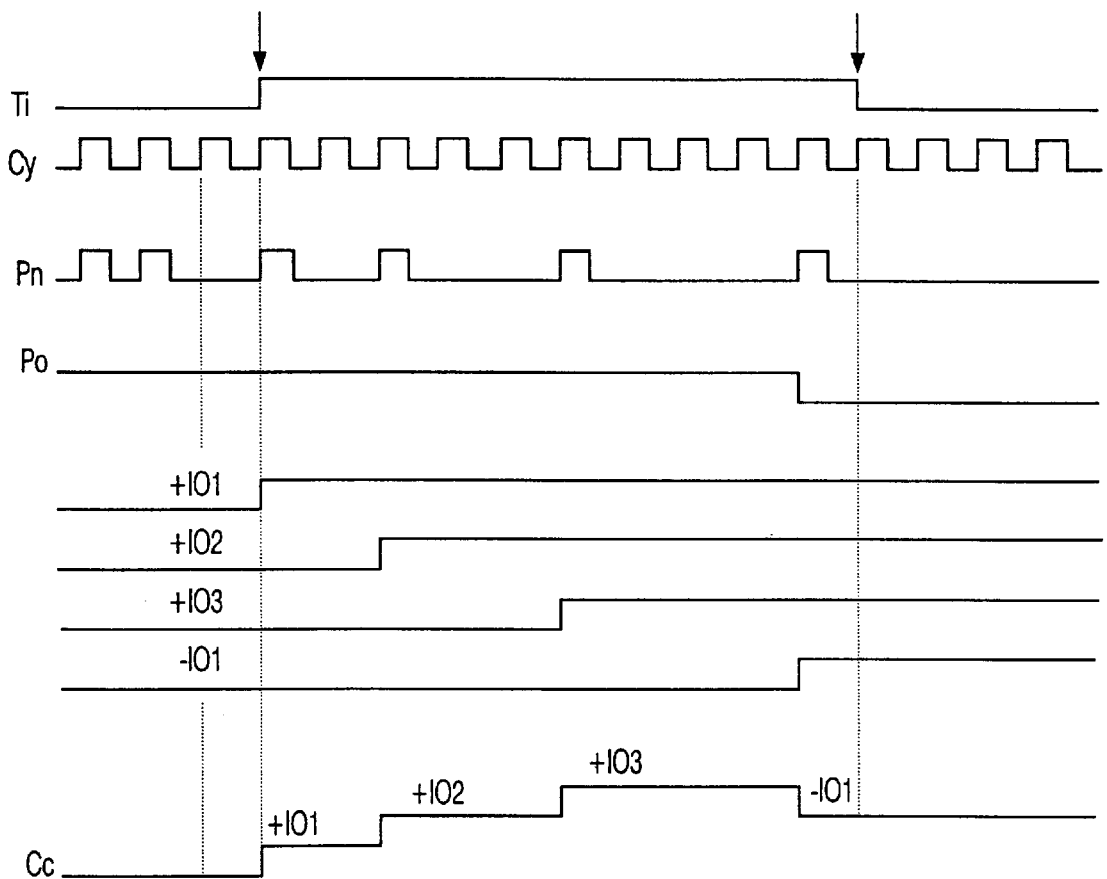
FIG. 3 shows some signals as a function of time of the arrangement shown in FIG. 1, during the end phase of a switch-on phase.

The mode of operation of the arrangement 1 for offset current compensation according to the invention, as shown in FIGS. 1 and 2, will hereinafter be elucidated with reference to a time diagram which is shown in FIG. 3.

The time diagram in FIG. 3 shows the signal Ti which indicates the time interval of the switch-on phase in which the arrangement according to the invention operates. This time interval is advantageously chosen to be such that it lies at the end of the switch-on phase of the phase-locked loop. This is also assumed in the time diagram in FIG. 3.

FIG. 3 shows that the signal Ti has a high level during this time interval, whereas it has a low level during the remaining time. With the end of the high level of the signal Ti, the end of the switch-on phase of the overall phase-locked loop is also reached.

FIG. 3 further shows the cycle signal Cy which predetermines the operating cycli of the acquisition circuit 7 as well as the correction cycli of the arrangement 1 according to the invention, shown in FIG. 1.

Furthermore, the Figure shows the control signal Pn which triggers the acquisition pulses. When pulses occur in the control signal Pn, the acquisition circuit 7 of the arrangement of FIG. 1 supplies acquisition pulses.

The sign of the acquisition pulses is controlled by the control signal Po which is also shown in FIG. 3. The acquisition pulses have a positive sign at a high level of the signal Po and a negative sign at a low level of this signal.

FIG. 3 further shows three correction sub-currents +IO1, +IO2, +IO3 and −IO1 whose generation will be elucidated hereinafter. These four correction sub-currents are overall superimposed to an offset correction current Cc which is also shown in FIG. 3 and which serves for correcting the offset current of the phase detector 4 of the phase-locked loop 2 of the circuit shown in FIG. 1.

The arrangement 1 for offset current compensation determines whether the signal Pn indicates acquisition pulses during its operating phase, i.e. the time interval of the switch-on phase which is predetermined by the signal Ti and its high level. In each correction cycle, which is predetermined by the signal Cy, it is determined whether such an acquisition pulse is present and which sign it has. In the example shown in FIG. 3, such a pulse actually occurs in the signal Pn at the start of the operating phase. The signal Po indicates that the acquisition pulse has a positive sign. A correction sub-current +IO1 is then added to the offset correction current Cc. This can be recognized in the Figure in that the signal +IO1 changes from a low to a high level and the value of the offset correction current Cc increases accordingly. In the next correction cycle, which is predetermined by the signal Cy, no acquisition pulse occurs in the signal Pn. In the third correction cycle of the arrangement 1, however, an acquisition pulse does occur which again has a positive sign. Therefore, the next correction sub-current +IO2 is added to the offset correction current Cc. Again, no acquisition pulses occur in the next two correction cycli, but such an acquisition pulse again having a positive sign again occurs in the subsequent correction cycle so that a further correction sub-current +IO3 is added to the offset correction current Cc.

FIG. 3 shows that the offset correction current is thus further increased and has now already reached the value of three correction sub-currents.

After several correction cycli, in which no acquisition pulse occurs, such an acquisition pulse does, however, occur again towards the end of the time interval. However, this pulse now has a negative sign, as is indicated by the signal Po. The operating frequency of the controllable oscillator 6 has now drifted in the opposite direction and should be corrected accordingly. This is effected by means of the acquisition circuit and with the aid of an acquisition pulse having a negative sign.

However, for the arrangement according to the invention, this means that an offset correction sub-current having a negative sign should now be added, which is denoted by −IO1 in the Figure.

FIG. 3 shows that the overall offset correction current Cc decreases accordingly.

After this correction cycle, the end of both the switch-on phase and the time interval in which the arrangement according to the invention operates is reached, and an offset correction current Cc has been determined which compensates an offset current supplied by the phase detector 4 by means of the arrangement 1 and thus ensures an optimal mode of operation of the phase-locked loop 2 of the circuit shown in FIG. 1.

What is claimed is:

1. An arrangement for offset current compensation of a phase detector (4) which is provided in a phase-locked loop (2) to which an acquisition circuit (7) is assigned which, in a switch-on phase of the phase-locked loop (2), supplies acquisition pulses to a loop filter (5) arranged in the phase-locked loop (2) before applying an input signal to the phase-locked loop (2) so as to bring the operating frequency of a controllable oscillator (6) in the phase-locked loop within a predetermined frequency window, characterized in that the arrangement (1) determines an offset correction current during at least one time interval of the switch-on phase when acquisition pulses occur, which offset correction current serves for compensating the offset current of the phase detector (4), the value and the sign of the offset correction current being selected in dependence upon the rate and sign of the acquisition pulses in such a way that no acquisition pulses occur any longer at the end of the switch-on phase, and in that the arrangement (1) superimposes the offset correction current thus determined on the output signal of the phase detector (4) also during operation of the phase-locked loop outside the switch-on phase.

2. An arrangement as claimed in claim 1, characterized in that the arrangement (1) determines the value and the sign of the offset correction current in correction cycle, in which in each cycle a correction sub-current having a sign suitable for decreasing the offset current is added to the offset correction current in dependence upon the occurrence of an acquisition pulse and its sign.

3. An arrangement as claimed in claim 2, characterized in that the arrangement (1) comprises a decoder (22) which evaluates control signals by means of which the acquisition pulses and their signs are controlled, and which controls a register (23) by means of which the correction sub-currents are switchable, which sub-currents are supplied by current sources (24) and have the same value but both signs.

4. An arrangement as claimed in claim 3, characterized in that n correction sub-currents with positive and negative signs each having the same value are switchable by means of the register (23) and the current sources (24).

5. An arrangement as claimed in claim 2, characterized in that the correction cycle are selected in accordance with operating cycle of the acquisition circuit (7).

6. An arrangement as claimed in claim 1, characterized in that the arrangement (1) redetermines the offset correction current after each activation of the current supply of the phase-locked loop (2) during at least a time interval of the switch-on phase.

7. An arrangement as claimed in claim 1, characterized in that the phase-locked loop (2) is preceded by a switch (3) which does not apply an input signal to the phase-locked loop (2) until after termination of the switch-on phase.

8. An arrangement as claimed in claim 1, characterized in that the arrangement (1) evaluates the acquisition pulses and determines the offset correction current during a predeterminable period of time which is at the end of the switch-on phase and whose start is selected in such a way that the acquisition circuit (7) has brought the operating frequency of the controllable oscillator (6) at least within the proximity of the frequency window by means of the acquisition pulses.

9. An arrangement as claimed in claim 1, characterized in that currents are superimposed on the offset correction current in the phase comparator, which currents are generated by means of current sources assigned to a differential amplifier in the phase comparator.

10. An arrangement as claimed in claim 1, characterized in that the offset correction current is superimposed on the output signal of the phase comparator.

11. A phase-locked loop comprising an arrangement (1) for offset current compensation as claimed in claim 1.

* * * * *